United States Patent [19]

Minami et al.

[11] Patent Number: 4,509,067
[45] Date of Patent: Apr. 2, 1985

[54] SEMICONDUCTOR INTEGRATED CIRCUIT DEVICES WITH PROTECTIVE MEANS AGAINST OVERVOLTAGES

[75] Inventors: Kenji Minami, Kawasaki; Masaru Katagiri; Hideo Noguchi, both of Yokohama, all of Japan

[73] Assignee: Tokyo Shibaura Denki Kabushiki Kaisha, Japan

[21] Appl. No.: 354,397

[22] Filed: Mar. 3, 1982

[30] Foreign Application Priority Data

Jun. 23, 1981 [JP] Japan ..................... 56-96887

[51] Int. Cl.[3] ............... H01L 29/90; H01L 29/78; H01L 27/02
[52] U.S. Cl. .................... 357/13; 357/23.13; 357/41; 357/51; 307/200 B
[58] Field of Search ............. 357/13, 23 GP, 51, 41, 357/23.11; 307/200 B; 361/56

[56] References Cited

U.S. PATENT DOCUMENTS 4,394,674 7/1983 Sakuma et al. ............... 357/41
4,423,431 12/1983 Sasaki ....................... 357/41

FOREIGN PATENT DOCUMENTS 46-10457 3/1971 Japan .
46-8011 3/1971 Japan .
53-9484 1/1978 Japan ..................... 357/23 GP
54-116887 9/1979 Japan ..................... 357/23 GP
54-140480 10/1979 Japan ..................... 357/23 GP
54-136278 10/1979 Japan ..................... 357/23 GP
55-127055 10/1980 Japan ..................... 357/13 LM Primary Examiner—Andrew J. James
Assistant Examiner—J. Caroll
Attorney, Agent, or Firm—Finnegan, Henderson, Farabow, Garrett & Dunner

[57] ABSTRACT

An additional N+ region is provided in a P type substrate adjacent to a protective N+ resistor region with an insulating layer and metal layer interposed between the N+ region and the N+ resistor region. The N+ resistor region, the oxide layer, the polysilicon layer and N+ region constitute an MOS transistor, respectively corresponding to a drain region, a gate insulating layer, a gate electrode and a source region of the MOS transistor. When a very high excessive voltage that otherwise would destroy the PN junction between the substrate and the resistor region is applied to the input terminal, the MOS transistor is rendered conductive and the excessive voltage is absorbed.

4 Claims, 12 Drawing Figures

SEMICONDUCTOR INTEGRATED CIRCUIT DEVICES WITH PROTECTIVE MEANS AGAINST OVERVOLTAGES

BACKGROUND OF THE INVENTION

I. Field of the Invention

This invention relates to a semiconductor integrated circuit device and more particularly to improvements in a protective device for protecting an insulated gate field effect transistor against overvoltages.

II. Description of the Prior Art

Conventionally, as shown in FIGS. 1A, 1B and 1C, there is illustrated a semiconductor protective device for protecting an active element such as an insulated gate field effect transistor (IGFET) against overvoltages.

The prior art arrangement comprises an IGFET 2 which is to be protected including a gate electrode G connected through a protective resistor R to input terminal 1. The resistor R is formed by diffusing an N type impurity into the P type semiconductor substrate 3 on which the IGFET 2 has been formed. A channel stopper 7 of P+ type impurity is provided under field oxide layer 9 but not under the MOS transistor 2 and resistor R. The channel stopper 7 prevents leakage current.

If an excessive voltage higher than the breakdown voltage of the gate insulating film of the IGFET 2 is applied to the input terminal 1, the PN junction between the resistor N+ region 4 and the P substrate is designed to begin to breakdown. But, if the voltage is excessively high, such as may be caused by a voltage surge, the PN junction between the N+ resistor region 4 and the P type substrate 3 is destroyed and the MOS transistor does not operate. The destruction tends to occur at the portion 8 between the N+ resistor region 4 and the P+ channel stopper 7 because the impurity concentration of the P+ channel stopper 7 is higher than that of the P type substrate 3.

Accordingly, the semiconductor integrated circuit will no longer work when an input signal is applied to the input terminal 1.

SUMMARY OF THE INVENTION

Therefore, one object of this invention is to provide an improved protective device against destruction of an active element by an overvoltage.

Another object of this invention is to provide a protective device against overvoltage in which the pn junctions will not be destroyed.

According to this invention a semiconductor integrated circuit device having an active element such as an IGFET which requires protection against overvoltages comprises a semiconductor substrate of a first-conductivity type, an insulated gate field effect transistor (IGFET) formed in the semiconductor substrate having gate, source and drain regions, a protective resistor region of a second conductivity type opposite to the first conductivity type formed in the surface of the semiconductor substrate, the input protective resistor region being connected to the gate region of the IGFET, an input contact portion in the resistor region for connection to the resistor region through a wiring layer, another second conductivity type region in the semiconductor substrate surrounding at least the input contact portion, said second conductivity type region being insulated by an insulating layer, and a conductive layer formed on the insulating layer and connected to the resistor region.

BRIEF DESCRIPTION OF THE DRAWINGS

The exact nature of this invention, as well as other objects and advantages thereof, will be readily apparent from consideration of the following specification relating to the annexed drawings, in which like reference characters designate the same or similar parts throughout the figures and wherein.

DESCRIPTION OF THE PREFERRED EMBODIMENTS

Figure 1A:
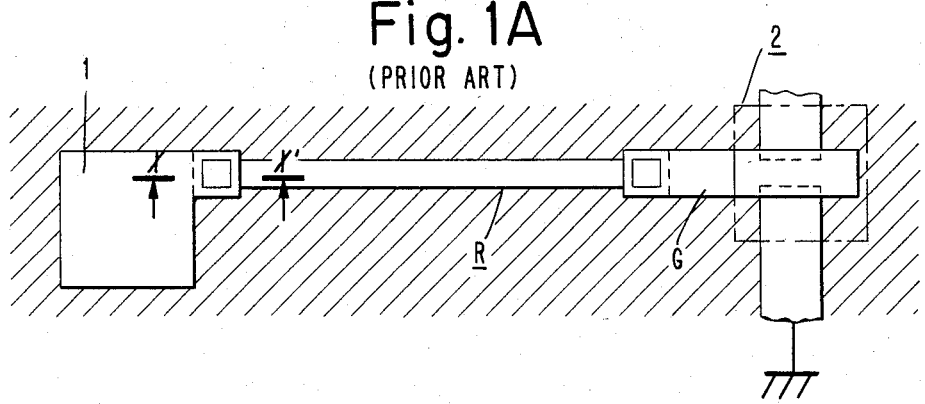
FIG. 1A is a prior art pattern layout showing an input protective circuit for an IGFET.
Figure 1B:
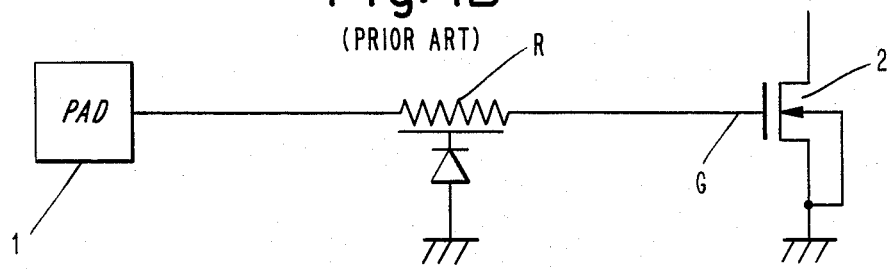
FIG. 1B is a prior art schematic circuit diagram showing an input protective circuit for an IGFET.
Figure 1C:
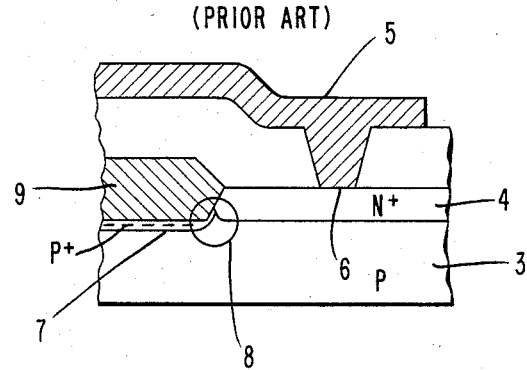
FIG. 1C is sectional view along line X—X' of FIG. 1A.

There will now be described an integrated circuit having a protective device according to an embodiment of this invention with reference to FIGS. 2A to 2C. A wiring layer 5 is composed of an aluminum layer on an insulating layer 9 extending to the input terminal 1 and contacting a N+ resistor region 4 at a contact portion 6. As here embodied the N+ region 4 is formed on a P-type substrate and connected to polysilicon gate electrode 2a of IGFET 2. It will be understood that other active elements can be protected in addition to an IGFET. A N+ region 11 is formed, insulated by insulating layer 9a, to surround a substantial portion of the N+ resistor region 4 as extending toward the electrode 2a. The insulating layer 9a is formed at the same time that the field oxide layer 9b is formed using a Local Oxidation of Silicon (LOCOS) method. A P+ channel stopper region 7 is provided under the insulating layer 9a and the field oxide layer 9b. A polysilicon electrode layer 10 is provided on the insulating layer 9a extending to and contacting the N+ resistor region 4.

In this embodiment, the N+ resistor region 4, the insulating layer 9a, the polysilicon layer 10 and the N+ region 11 constitute a MOSFET 20, respectively corresponding to a drain region, a gate insulating layer, a gate electrode and a source region of the MOSFET. An end portion of N+ region 11 is connected to one power source (GND or $V_{DD}$) through a terminal 13 and a metal layer 12. However, metal layer 12 may be connected to other wiring layers and should have a capacitance large enough to absorb excessive charges from surges. The wiring layer 5 is located over the MOSFET 20. The polysilicon layer 10 only overlays half of the insulating layer 9a, and the metal layer 5 instead of polysilicon layer 10 works as a gate electrode for the remaining portion of the MOSFET 20.

MOSFET 20 is designed to conduct only when excessive surge voltage is applied to terminal 1. This is achieved by forming the gate electrode 10 over only a portion of the gate insulating layer 9a so that the gate electroe does not contact the source region 11.

Figure 2A:
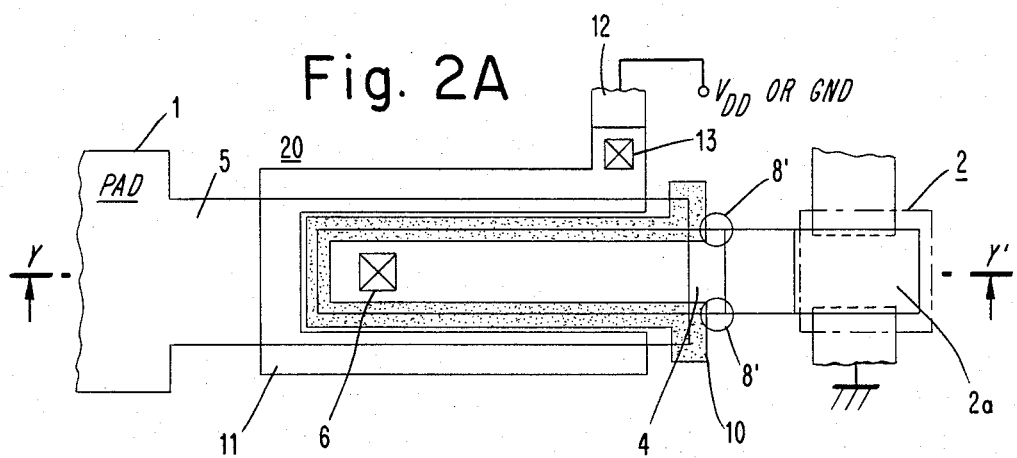
FIG. 2A is a pattern layout showing a first embodiment according to this invention.
Figure 2B:
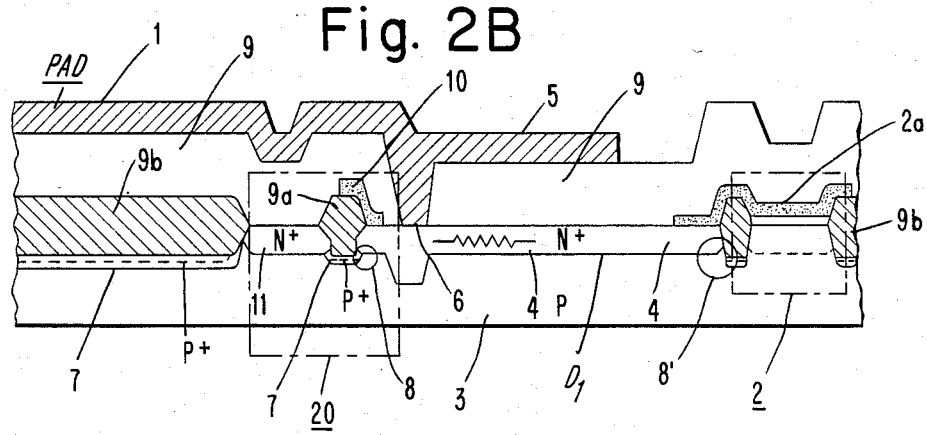
FIG. 2B is a sectional view along line Y—Y' of FIG. 2A.
Figure 2C:
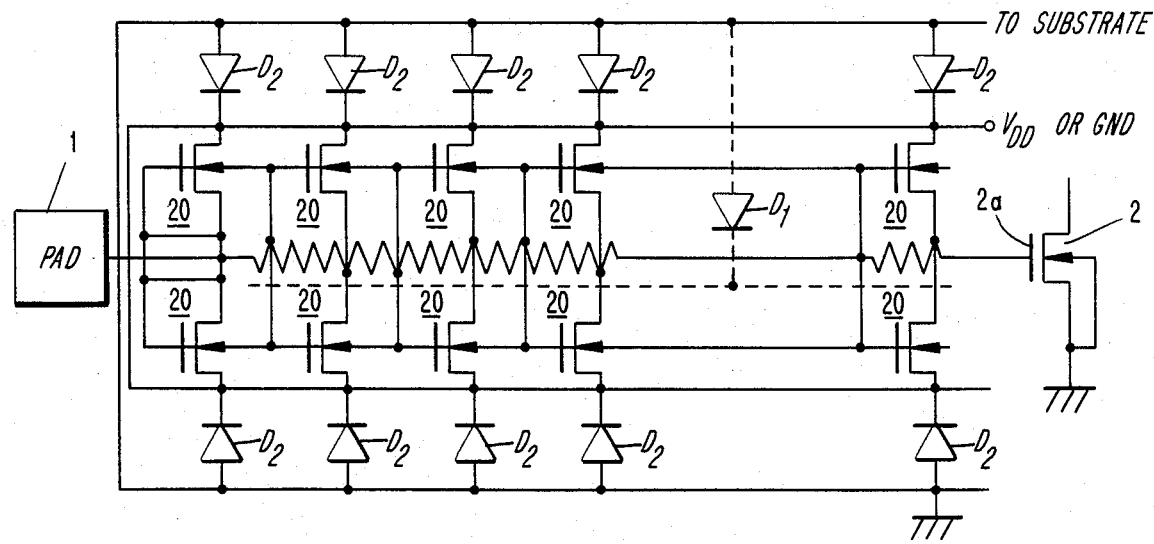
FIG. 2C is schematic circuit diagram corresponding to integrated circuit device shown in FIGS. 2A and 2B.

A circuit schematic of protective device 20 is shown in FIG. 2C as a plurality of elements surrounding resistor 12. The MOSFET 20 is connected between resistor N+ region 4 and a power source ($V^{DD}$ or ground) as a protective device as shown in FIG. 2C. An effective diode $D_2$ formed between the channel stopper region 7 and the N+ region 11 is connected between the power source ($V_{DD}$ or GND) and the substrate 3. Normally, when an excessive voltage is applied to input terminal 1, a breakdown of the pn junction formed between the N+ resistor region 4 and the channel stopper region 7, namely in region 8', occurs and the excessive voltage is absorbed into substrate 3. The MOSFET 20 is not rendered conductive under these conditions. Further no breakdown occurs at region 8 since a voltage exists reducing the impurity concentration of the P+ channel-stopper 7. Accordingly, the destruction of the gate insulating layer of the IGFET 2 is prevented.

However, when an excessively high voltage, such as a surge, that would otherwise destroy the PN junction between resistor region 4 and substrate 3 is applied to the input terminal 1 it is absorbed by the MOSFET 20 which has a high resistivity. Only when the very high excessive voltage that would destroy the PN junction is applied to input terminal 1, is MOSFET 20 rendered conductive. Therefore, current concentration at portion 8' is prevented, and the destruction of the PN junction is prevented, sufficiently protecting the gate electrode 2a of IGFET 2.

Figure 3A:
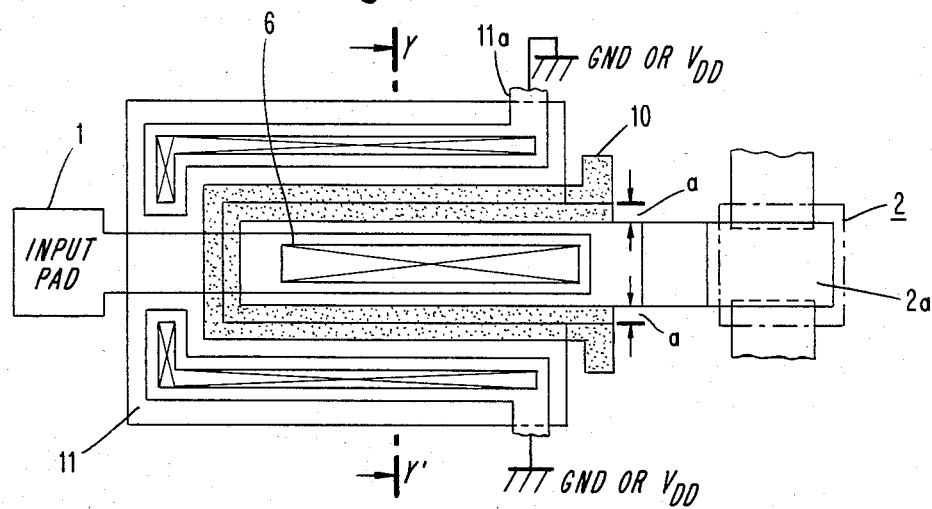
FIG. 3A is a pattern layout showing a second embodiment according to this invention.
Figure 3B:
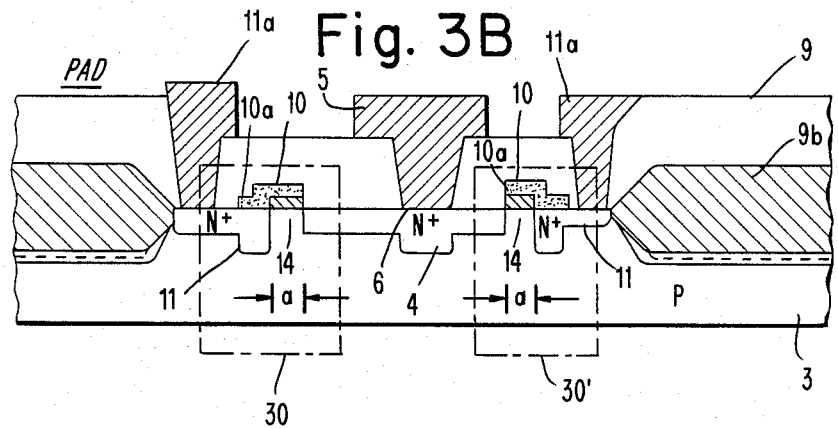
FIG. 3B is a sectional view along line Y—Y' of FIG. 3A.
Figure 3C:
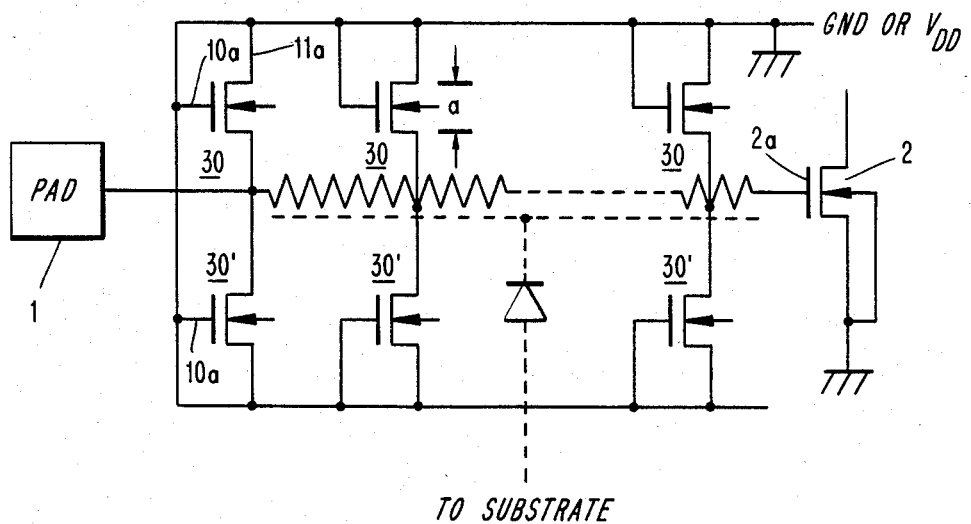
FIG. 3C is a schematic circuit diagram corresponding to integrated circuit devices shown in FIGS. 3A and 3B.

FIGS. 3A to 3C show a second embodiment of the present invention.

This embodiment is similar to the first embodiment as shown in FIGS. 2A to 2C except that MOSFETs 30 and 30' use a thin gate insulating layer 14 and that conductive layer 10 (e.g. metal or polysilicon) on the insulating layer 14 is contacted with the N+ region 11. The distance between the N+ region 11 and N+ resistor region 4 is designed so as to cause a punch through phenomenon or surface breakdown when a very high excessive voltage that could destroy the PN junction is applied to input terminal 1. Therefore the excess voltage is absorbed by the MOSFET 30. The small gap a between the N+ regions 4 and 11 is easily formed by using a self-alignment method as is well-known. It is desirable to have the area of contact of portion 6, which extends toward the gate electrode 10 of the MOSFET 30, as large as possible. The N+ region 11 is connected to the power source (GND).

As shown in FIG. 3A MOSFETs 30 and 30' which more effectively control surge voltages, extend around the longitudinally extended contact region 6 which connects to IGFET 2. This is a particular advantage of this embodiment.

A circuit diagram according to the FIGS. 3A and 3B is illustrated in FIG. 3C. The gate electrode 10A and source electrode 11a are connected together to the power source ($V_{DD}$ or GND).

Figure 4A:
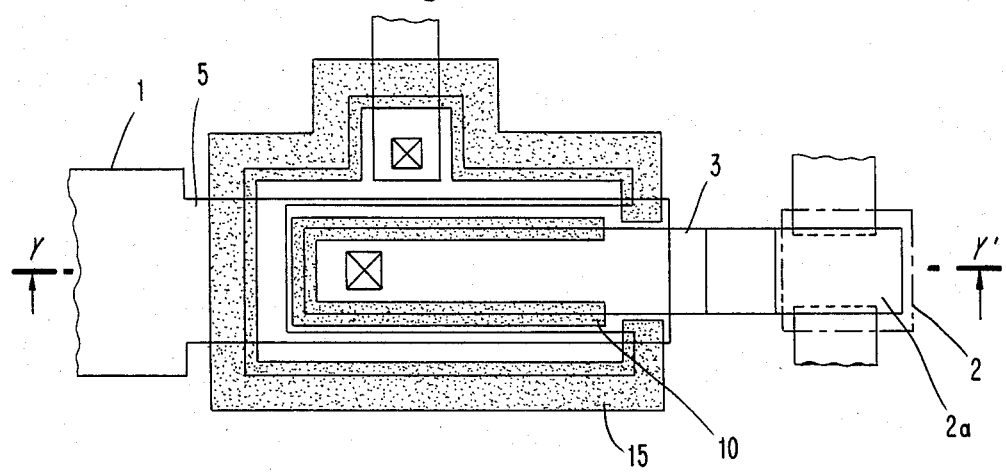
FIG. 4A is a pattern layout showing a third embodiment according to this invention.
Figure 4B:
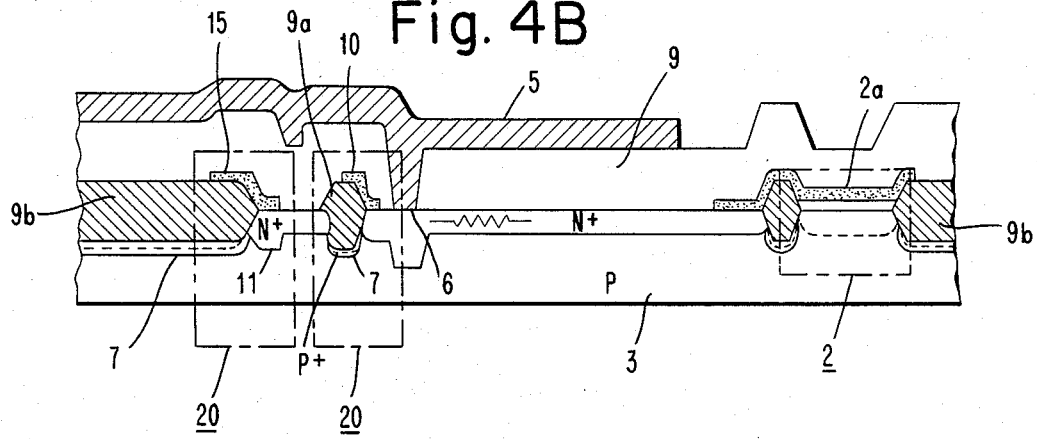
FIG. 4B is a sectional view along line Y—Y' of FIG. 4A.
Figure 4C:
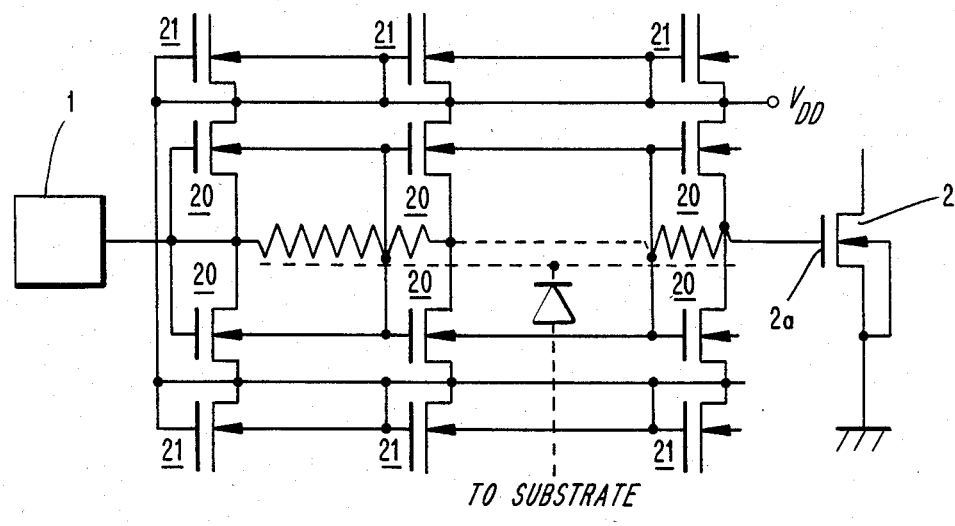
FIG. 4C is a schematic circuit diagram corresponding to integrated circuit devices shown in FIGS. 4A and 4B.

FIGS. 4A to 4C show a third embodiment of the present invention.

This embodiment also is similar to the first embodiment as shown in FIGS. 2A to 2C except that a second polysilicon layer 15 is formed on the field insulating layer 9 which contacts with the N+ region 11. The polysilicon layer 15, the field insulating layer 9 and the channel stopper 7 constitute a second MOSFET 21 of open drain type as shown in FIG. 4C.

In this embodiment, the protection is much increased by the MOSFET 21. MOSFET 21 increases the breakdown voltage at that region. Current will flow through resistor region 4 under normal circumstances and more effective use of resistor region 4 for protection is achieved. When positive voltage is applied to layer 15, the breakdown voltage between channel stopper 7, N+ region 11 and substrate 3 is increased thereby increasing protection against destruction of the PN junction. Layer 15 extends around contact strip 4 and protects other active elements adjacent to this circuit in substrate 3. Now, the polysilicon layer 15, although not so shown, may extend over the entire surface of the N+ region 11.

Although this invention has been disclosed and illustrated with reference to particular applications, the principles involved are susceptible of numerous other applications which will be apparent to those skilled in the art. The invention is, therefore, to be limited only as indicated by the scope of the claims.

What is claimed is:

1. A semiconductor integrated circuit comprising:
   a semiconductor substrate of a first conductivity type of a given impurity concentration;
   an active semiconductor element formed in said substrate;
   a protective resistor region of a second conductivity type opposite to said first conductivity type formed in the surface of the substrate, said protective resistor region being electrically connected to said active element;
   an input contact portion in said resistor region for connecting an input signal to said resistor region; and
   protective means including a metal oxide semiconductor field effect transistor formed to substantially surround said resistor region and electrically connected to said resistor region for being rendered conductive only by excessive voltage surges applied to said input contact portion of said resistor region and for absorbing such excess voltage surges and thereby protecting said active element; wherein said metal oxide semiconductor field effect transistor is comprised of said resistor region; a second conductivity type region in the semiconductor substrate substantially surrounding at least the input contact portion of said resistor region; an insulating layer formed adjacent to and insulating said second conductivity type region from said resistor region; a conducting layer formed at least in part on the insulating layer and extending over at least a part of said resistor region; and a channel stopper region of said first conductivity type having a higher impurity concentration than said substrate and located below and in contact with said insulating layer.

2. The semiconductor integrated circuit of claim 1 further including an additional insulating layer abutting the periphery of said second conductivity type region of said protective means.

3. The semiconductor integrated circuit of claim 2 further including a second channel stopper region of said first conductivity type having a higher impurity concentration than said substrate, said second semiconductor region located below and in contact with said additional insulating layer.

4. A semiconductor integrated circuit device comprising:
- a semiconductor substrate of first conductivity type;
- an insulated gate field effect transistor (IGFET) formed in the semiconductor substrate and having a gate region;
- a protective resistor region of second conductivity type opposed to the first conductivity type formed in a surface of the semiconductor substrate, said protective resistor region being connected to the gate region of the IGFET;
- an input terminal;
- an input contact portion of the resistor region for connecting the input terminal to the resistor region;
- another second conductivity type region in the semiconductor substrate adjacent said resistor region and substantially surrounding at least the input portion;
- a thin insulating film bridging the resistor region and the another second conductivity region; and
- a conductive layer formed on the thin insulating film and in contact with the another second conductivity type region, wherein there is a surface breakdown between the resistor region and the another second conductivity type region when an excessively high voltage is applied to the input terminal.

* * * * *